(12) United States Patent
Gu et al.

(10) Patent No.: US 11,193,959 B2
(45) Date of Patent: Dec. 7, 2021

(54) INTEROMETRIC VOLTAGE SENSOR WITH ERROR COMPENSATION

(71) Applicant: Hitachi Energy Switzerland AG, Baden (CH)

(72) Inventors: Xun Gu, Neuenhof (CH); Klaus Bohnert, Oberrohrdorf (CH); Sergio Vincenzo Marchese, Zürich (CH)

(73) Assignee: Hitachi Energy Switzerland AG, Baden (CH)

( * ) Notice: Subject to any disclaimer, the term of this patent is extended or adjusted under 35 U.S.C. 154(b) by 312 days.

(21) Appl. No.: 15/695,858

(22) Filed: Sep. 5, 2017

(65) Prior Publication Data
US 2018/0067147 A1    Mar. 8, 2018

(30) Foreign Application Priority Data
Sep. 2, 2016   (EP) .................................... 16187127

(51) Int. Cl.
*G01R 15/24* (2006.01)
*G01R 19/00* (2006.01)
(Continued)

(52) U.S. Cl.
CPC ......... *G01R 15/241* (2013.01); *G01R 15/242* (2013.01); *G01R 15/245* (2013.01);
(Continued)

(58) Field of Classification Search
None
See application file for complete search history.

(56) References Cited

U.S. PATENT DOCUMENTS 4,372,685 A * 2/1983 Ulrich ................... G01P 13/045
356/464
4,539,521 A * 9/1985 Matsumoto ........ G01R 33/0322
250/225

(Continued)

FOREIGN PATENT DOCUMENTS

CN        102981136 A  *  3/2013
EP         2715375 A1      4/2014
(Continued)

OTHER PUBLICATIONS

EIC 2800 STIC Search Report (Year: 2019).*
(Continued)

*Primary Examiner* — Catherine T. Rastovski
*Assistant Examiner* — Leonard S Liang
(74) *Attorney, Agent, or Firm* — Sage Patent Group

(57) ABSTRACT

In order to measure a voltage, an electro-optic element is placed in an electrical field generated by the voltage, and light is passed from a light source through a Faraday rotator and the electro-optic element onto a reflector and from there back through the electro-optic element and the Faraday rotator, thereby generating a voltage-dependent phase shift between two polarizations of the light. The interference contrast as well as a principal value of the total phase shift between said polarizations are measured and converted to a complex value having an absolute value equal to the contrast and a phase equal to the principal value. This complex value is offset and scaled using calibration values in order to calculate a compensated complex value. The voltage is derived from the compensated complex value.

18 Claims, 3 Drawing Sheets

(51) Int. Cl.
    *G01R 35/00* (2006.01)
    *G02F 1/01* (2006.01)
    *G01C 19/72* (2006.01)
    *G01R 33/032* (2006.01)
(52) U.S. Cl.
    CPC ....... *G01R 15/246* (2013.01); *G01R 19/0084* (2013.01); *G01R 35/005* (2013.01); *G01C 19/72* (2013.01); *G01R 15/247* (2013.01); *G01R 33/0322* (2013.01); *G02F 1/0136* (2013.01)

(56) References Cited

U.S. PATENT DOCUMENTS

| | | | | |
|---|---|---|---|---|
| 5,309,912 A * | 5/1994 | Knuttel | ............. | G01N 21/4795 600/425 |
| 5,327,213 A * | 7/1994 | Blake | .................... | G01C 19/72 356/460 |
| 5,377,283 A * | 12/1994 | Blake | .................. | G01C 19/721 385/11 |
| 5,390,023 A * | 2/1995 | Biegen | ...................... | G01B 9/04 356/497 |
| 5,477,323 A * | 12/1995 | Andrews | ................ | G01D 5/266 356/477 |
| 5,513,003 A * | 4/1996 | Morgan | ................ | G01C 19/726 356/464 |
| 6,078,706 A * | 6/2000 | Nau | .................... | G01D 5/35303 356/35.5 |
| 6,128,080 A * | 10/2000 | Janik | ..................... | G01N 21/45 356/491 |
| 6,128,127 A * | 10/2000 | Kusaka | .................... | G01B 9/04 359/371 |
| 6,215,295 B1 * | 4/2001 | Smith, III | ......... | G01R 1/06772 324/601 |
| 6,246,893 B1 * | 6/2001 | Gobeli | ............... | A61B 5/14558 600/318 |
| 7,414,728 B2 * | 8/2008 | Caplan | ................ | G02B 6/2726 356/477 |
| 7,557,929 B2 * | 7/2009 | Fang-Yen | .......... | G01B 9/02072 356/484 |
| 7,911,196 B2 * | 3/2011 | Bohnert | ............... | G01R 15/247 324/96 |
| 9,389,248 B2 * | 7/2016 | Sasaki | .................. | G01R 15/246 |
| 9,766,099 B2 * | 9/2017 | Pechstedt | ............ | G01L 19/0092 |
| 10,247,761 B2 * | 4/2019 | Muller | ................. | G01R 15/247 |
| 10,302,411 B2 * | 5/2019 | Gu | ..................... | G01B 9/02067 |
| 2006/0152209 A1 * | 7/2006 | Sasaki | .................. | G01R 15/241 324/96 |
| 2006/0170410 A1 * | 8/2006 | Bjorn | ...................... | H04L 67/12 324/96 |
| 2009/0289617 A1 * | 11/2009 | Bohnert | ............... | G01R 15/247 324/96 |
| 2009/0290165 A1 * | 11/2009 | Bohnert | ............... | G01R 15/242 356/483 |
| 2010/0245841 A1 * | 9/2010 | Parriaux | ............ | G01D 5/24438 356/521 |
| 2011/0062314 A1 * | 3/2011 | Doege | ............... | H01L 27/14643 250/214 R |
| 2011/0135145 A1 * | 6/2011 | Sawada | ............. | G01M 11/0257 382/100 |
| 2011/0141478 A1 * | 6/2011 | Sasaki | ................. | G01R 15/246 356/483 |
| 2012/0283969 A1 * | 11/2012 | Bohnert | ............... | G01R 15/246 702/64 |
| 2013/0182620 A1 * | 7/2013 | Chaffee | ................. | H04B 10/11 370/310 |
| 2015/0115934 A1 * | 4/2015 | Mueller | ............... | G01R 15/246 324/96 |
| 2016/0305984 A1 * | 10/2016 | Bohnert | ............... | G01R 15/245 |
| 2016/0356823 A1 * | 12/2016 | Gu | .......................... | G01D 5/266 |
| 2016/0377660 A1 * | 12/2016 | Muller | .................. | G01R 15/247 324/96 |
| 2017/0026095 A1 * | 1/2017 | Ashrafi | ................ | H04B 7/0456 |
| 2017/0146685 A1 * | 5/2017 | Choi | .................. | E21B 47/0905 |
| 2018/0066932 A1 * | 3/2018 | Gu | ......................... | G01B 9/0201 |
| 2019/0154439 A1 * | 5/2019 | Binder | .................. | G01B 11/26 |

FOREIGN PATENT DOCUMENTS

| | | | | |
|---|---|---|---|---|
| EP | | 2952913 A1 * | 12/2015 | |
| EP | | 3290931 A1 * | 3/2018 | ........... G01R 15/241 |
| WO | | 2012/163923 A1 | 12/2012 | |
| WO | WO-2012163923 A1 * | | 12/2012 | ........... G01R 15/242 |
| WO | | 2015124676 | 8/2015 | |
| WO | WO-2015124678 A1 * | | 8/2015 | |

OTHER PUBLICATIONS

Roderick David Turner; "Dual Wavelength Fiber-Optic Polarimeter for Path-Integrated Strain Sensing: Application to the Measurement of Local Slope on a Flexible Beam"; A Thesis submitted in conformity with the requirements for the Degree of Doctor of Philosophy in the University of Toronto; 1990. (Year: 1990).*
Chartier, Hideur, Ozkul, Sanchez, and Stephan; Measurement of the elliptical birefringence of single-mode optical fibers; Oct. 20, 2001; vol. 40, No. 30/Applied Optics (Year: 2001).*
National Intellectual Property Administration, PR China, First Office Action issued in corresponding Chinese application No. 201710786706.9, dated Jun. 28, 2019, 15 pp.
Xiujuan Feng et al., Influences of Imperfect Polarization Induced Effect to the Quasi-Reciprocal Reflective Optical Voltage Sensor, Journal of Lightwave Technology, vol. 31, No. 16, Aug. 15, 2013, 8 pages.
Mohammad Hamed Samimi et al, Effect of Nonideal Linear Polarizers, Stray Magnetic Field, and Vibration on the Accuracy of Open-Core Optical Current Transducers, IEEE Sensors Journal, vol. 14, No. 10, Oct. 2014, 8 pages.
European Search Report, European Patent Application No. 16187127, Feb. 23, 2017, 4 pages.
Lefevre, H.; "The Fiber-Optic Gyroscope, Second Edition"; Artech House; 2014; 489 pages.

* cited by examiner

INTERFEROMETRIC VOLTAGE SENSOR WITH ERROR COMPENSATION

FIELD OF THE INVENTION

This invention pertains to the systematic error compensation scheme used in an optical voltage sensor. It relates to a method and a device for measuring voltages.

BACKGROUND OF THE INVENTION

The advantages of the reflective modulation phase detection (MPD) measurement scheme [2] are, in particular, the excellent stability of its scale factor and zero point, both of which are needed for the accurate measurement of a DC voltage. In order to achieve polarization mode swapping—a key requirement for reflective MPD—the concept uses a 45° Faraday rotator inserted between the polarization-maintaining (PM) fiber and the electro-optic crystal in the voltage sensor. An interference-contrast-based period disambiguation method has been developed to enable the extension of the unambiguous voltage measurement range to ±500 kV [1].

In a real optical voltage sensor, however, hard-to-avoid systematic errors such as Faraday rotation angle deviation and mechanical misalignment lead to additional measurement errors. Because of the different optical circuitry and a much larger phase measurement range (~14 phase periods for the voltage sensor vs. less than one period for FOCS), the compensation method currently used in the FOCS system (based on balancing the first-order temperature dependence of system parameters, including the sensing fiber Verdet constant and the QWR offset) is not applicable to the voltage sensor. Furthermore, the systematic error compensation scheme for the voltage sensor must also work well in conjunction with the period disambiguation method. In order to reach the required measurement accuracy, we have developed a novel method for systematic error compensation in a reflective MPD wide-range optical voltage sensor, to be described in this invention.

Modulation phase detection (MPD) [2] is a powerful interrogation technique to measure phase shift in an optical system. MPD sensors can e.g. be implemented in a reciprocal configuration, either in the form of a Sagnac interferometer or in a reflective form, in order to cancel phase shifts from additional birefringent elements in the system (such as PM fibers or the phase modulator crystal), which may drift slowly, e.g. with temperature change or mechanical disturbance.

The MPD detection scheme can also be used for optical voltage sensing. A suitable device is shown in FIG. 1. It comprises an MPD optoelectronics module 1 for generating waves along both polarization directions of a polarization maintaining (PM) fiber 2. A collimator 3 sends these waves through a 45° Faraday rotator 4 and into a first end of Pockels effect crystal 5, which is being exposed to the electrical field from the voltage to be measured. At the second end of the crystal, the waves are reflected by a reflector 6 and sent back through the components 1-5 and into MPD optoelectronics module 1.

Faraday rotator 4 rotates both linear polarizations from PM fiber 2 by 45° before they propagate along the electro-optic axes of sensing crystal 5 [3]. The reflected waves pass through Faraday rotator 4 again, further rotating the polarizations by 45° in the same direction, thereby making a combined 90° rotation from the input polarizations, which is equivalent to a swap between the two orthogonal linear polarizations.

The two returning polarizations are brought to interference in MPD optoelectronics module 1, which gives rise to a signal with a basically periodic dependence of the voltage to be measured.

If the voltage range exceeds the n-voltage of the sensing crystal (e.g. 75 kV for BGO), it is necessary to resolve the phase shift period ambiguity in order to uniquely determine the applied voltage. This is particularly critical for DC measurements, where history tracking methods such as zero-crossing counting are not applicable.

To this end, the interference contrast of a low-coherence light source can be used to determine the phase shift period [1]. It can be shown that for both an open-loop sinusoidal-modulation and a closed-loop square-wave modulation MPD system, it is possible to measure the interference contrast in addition to the phase shift principal value, and to combine them to determine a unique voltage value.

Ideally, Faraday rotator 4 has a perfect 45° rotation angle, and the PM fiber axes are aligned exactly at 45° with respect to the electro-optic axes of sensing crystal 5. In a real sensor, however, deviations in the Faraday rotation angle and angular alignment are difficult to avoid, and the Faraday rotation angle is also strongly dependent on wavelength and temperature. These systematic errors can cause the measurement result to deviate significantly from theoretical expectations.

SUMMARY OF THE INVENTION

Hence, the problem to be solved is to provide a method and device of this type with a large measurement range that are less sensitive to misalignments and/or variations of the rotation in the Faraday rotator.

This problem is solved by the method and device of the independent claims. Embodiments are given by dependent claims, their combinations and the description together with the drawings.

In particular, the method comprises the steps of:
Placing an electro-optic element in an electrical field generated by said voltage: The electro-optic element acts as a sensing device and advantageously has a birefringence depending on the electrical field.
Passing light from a light source through a Faraday rotator and through the electro-optic element onto a reflector and from there back through the electro-optic element and through the Faraday rotator: This light is used for probing the refractive index change in the electro-optic element. It will suffer a phase change between two polarizations, in particular between two polarizations that are oriented along the principal electro-optic axes of the electro-optic element. The phase shift is a function of the electrical field and therefore of the voltage to be measured.
Measure the interference contrast k as well as the principal value $\varphi$ of the total phase shift $\phi$ between said polarizations: As described e.g. in [1], these two parameters would basically suffice to determine the voltage. However, in the present context, they cannot be used directly due to the above-mentioned systematic errors.
Calculating a corrected interference contrast $\bar{k}$ and a corrected principal value $\bar{\varphi}$. These corrected values are calculated from the measured principal value $\varphi$ of a total phase shift $\phi$ using calibration values. Namely, the operation that converts the measured values k and $\varphi$ into the corrected values $\tilde{k}$ and $\tilde{\varphi}$ must fulfil the following mathematical properties:

$\tilde{\varphi} = \arg \tilde{K}, \tilde{k} = |\tilde{K}|,$ with $\tilde{K}$ being a compensated complex value given by $$\tilde{K} = \left[\frac{\text{Re}(K - K_0)}{r_1} + i\frac{\text{Im}(K - K_0)}{r_2}\right] r_0 \cdot e^{i\alpha}$$

wherein $r_1$, $r_2$, $K_0$ and $\alpha$ are calibration values, $r_0$ is a non-zero constant real value, and K is an uncompensated complex value given by the measured values k and $\varphi$ as $K = ke^{i\varphi}$ As a last step, deriving said voltage using the corrected interference contrast $\tilde{k}$ and the corrected principal value $\tilde{\varphi}$. This step can now e.g. proceed as described in [1], the content of which is herewith made part of the disclosure in its entirety by reference, but using the corrected values instead of the originally measured values.

The invention also relates to a device for measuring a voltage. The device comprises
a Faraday rotator,
an electro-optic element,
a reflector,
a light source positioned to send light through said Faraday rotator and said electro-optic element onto the reflector and from there back through said electro-optic element and said Faraday rotator, wherein two polarizations of said light (namely those polarized along the principal refractive index axes of the electro-optic element) suffer a voltage-dependent phase shift in said electro-optic element,
a light detector positioned to measure an interference between said two polarizations returning from that electro-optic element and said Faraday rotator, and
a control unit adapted and structured to carry at the steps described above.

The method can further comprise calibration steps. These calibration steps comprise:
subjecting the electro-optic element to a varying electrical field, and
measuring said interference contrast k as well as said principal value $\varphi$ for several values of said varying electrical field and calculating at least one said calibration values $r_1$, $r_2$, $K_0$ therefrom.

In other words, the contrast and principal value are measured for a plurality of voltage values of the reference voltage. Using the measured values of the contrast and principal value at the several voltage values, one or more of the calibration values can then be calculated.

Measuring the calibration values in this manner allows to subsequently measure the voltage accurately and quickly.

Advantageously, all the calibration values are calculated in said calibration steps.

In yet another advantageous embodiment the varying electrical field is varied over a range sufficient to generate phase shifts between said polarizations that vary by at least $\pi$, in particular by at least $2\pi$.

This is based on the understanding that the uncompensated complex value K is substantially periodic in the phase shift between the polarizations and describes a spiral in the complex plane. The center as well as the real and imaginary axis amplitudes of this spiral basically describe the calibration values. The complex argument of K substantially corresponds to the phase shift between the polarization. The center and axis amplitudes of the spiral can best be determined by varying the phase shift by at least $\pi$, in particular by at least $2\pi$.

The calibration steps advantageously comprise the step of determining a center and real and imaginary scaling factors of a spiral connecting said uncompensated complex value K when varying said principal value $\varphi$.

The invention is based on the idea that a refined model and scheme are needed to account for and compensate errors caused by misalignment of the components and non-45° rotations in the Faraday rotator.

The invention is particularly suited to measure high voltages of at least 100 kV, in particular of at least 500 kV. It can advantageously be used for DC voltages. But it can also be used for measuring AC voltages, in which case the rising of falling slope of the voltage can be used to determine the corrected values $\tilde{k}$ and $\tilde{\varphi}$.

The technique can provide high accuracy, with errors <0.2%.

The sensor and method are e.g. ideal for various HVDC applications, including HVDC Light, HVDC Classic, and HVDC for offshore DC applications, e.g. in a DC GIS. Accordingly, the invention also relates to the use of the device or method for measuring a DC voltage of at least 100 kV.

BRIEF DESCRIPTION OF THE FIGURES

The invention will be better understood and objects other than those set forth above will become apparent when consideration is given to the following detailed description thereof. This description makes reference to the annexed drawings, wherein:

FIG. 3b shows uncompensated phase measurement errors, i.e. $\arg K - pv(\varphi_0 + \pi)$, for the two non-ideal sensors of FIG. 3a;

DETAILED DESCRIPTION

Figure 1:
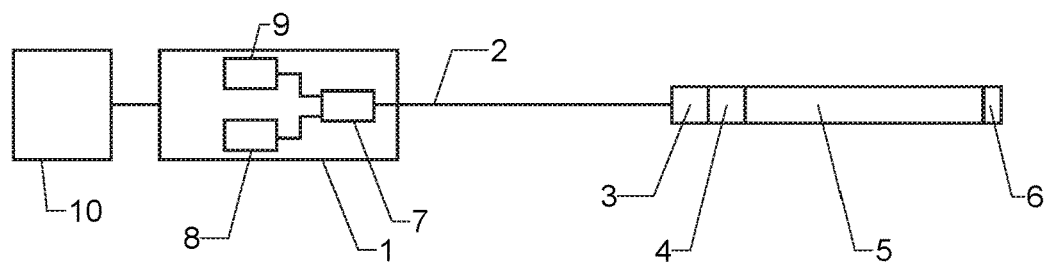
FIG. 1 shows a device for the electro-optic measurement of voltages.

Introduction, Device:

The basic principles of the device of FIG. 1 have already been described.

It comprises an MPD optoelectronics module 1 for generating waves along both polarization directions of a polarization maintaining (PM) fiber 2. A collimator 3 sends these waves through a 45° Faraday rotator 4 and into a first end of Pockels effect crystal 5, which is being exposed to the electrical field from the voltage to be measured. At the second end of the crystal, the waves are reflected by a reflector 6 and sent back through the components 1-5 and into MPD optoelectronics module 1.

Faraday rotator 4 rotates both linear polarizations from PM fiber 2 by 45° before they propagate along the electro-optic axes (principal refractive index axes) of sensing crystal 5 [3]. The reflected waves pass through Faraday rotator 4 again, further rotating the polarizations by 45° in the same direction, thereby making a combined 90° rotation from the input polarizations, which is equivalent to a swap between the two orthogonal linear polarizations.

MPD optoelectronics module 1 is adapted to measure the interference contrast k as well as the principal value pv of the total phase shift $\varphi$ between the two polarizations returning from PM fiber 2, i.e. $\varphi=pv(\varphi)=\varphi \mod 2\pi$.

The optoelectronics module 1 comprises a phase modulator 7 adapted to introduce a phase shift $\varphi_m$ between the two light polarizations returning in PM fiber 2 before they are brought to interference in a detector 8.

It further comprises a light source 9 generating the light to pass through PM fiber 2 and crystal 5. The coherence length of light source 9 is advantageously between $5 \cdot \lambda_0$ and $100 \cdot \lambda_0$, with $\lambda_0$ being the center wavelength of the light source, in order to obtain a good variation of interference contrast k when changing the phase between the two polarizations by a few multiples of $2\pi$.

The device further comprises a control unit 10 adapted and structured to carry out the measurement and error compensation methods described below. It can e.g. be formed by a microprocessor or microcontroller provided with suitable interface circuits.

The interference contrast k and principal value $\varphi$ can e.g. be determined e.g. as described in [1], the disclosure of which is incorporated herein by reference in its entirety.

In the following, we show that the trace of a complex output with its absolute value equal to the MPD-measured interference contrast k and its argument equal to the MPD-measured phase shift principal value $\varphi$ is a spiral curve in the complex plane. The influence of systematic errors in a reflective optical voltage sensor, such as Faraday rotation angle error and axis alignment error, can be represented as a shift of the spiral center from the complex plane origin, and scaling of the spiral radii along the real and imaginary axes. The systematic measurement error can then be compensated by recentering and rescaling the measured spiral trace, yielding a more accurate phase shift measurement.

Ideal System with Monochromatic Light Source:

Mathematically, the propagation of polarized light in an ideal voltage sensor between the two passes through Faraday rotator 3 can be described by a Jones matrix in the basis of the linear polarizations in the PM fiber axes as $$T = \begin{bmatrix} f & -g^* \\ g & f^* \end{bmatrix} = R(-45°)R(-45°)S(\phi)R(-45°)R(45°) = R(-90°)S(\phi)R(0°)$$

where the matrix $$R(\theta) = \begin{bmatrix} \cos\theta & -\sin\theta \\ \sin\theta & \cos\theta \end{bmatrix}$$

describes rotation by $\theta$ in the linear basis, and $$S(\phi) = \begin{bmatrix} ie^{i\phi/2} & 0 \\ 0 & -ie^{-i\phi/2} \end{bmatrix}$$

describes the forward and return passes through the sensing crystal with a reflection in between. The double-pass electro-optic phase shift $\varphi$ is proportional to the applied voltage V, which we aim to recover from the measurement. From right to left in sequence, the component matrices represent a 45° Faraday rotation, a −45° rotation between PM fiber 2 and sensing crystal 4 electro-optic axes, mirror reflection, the phase delay in crystal 4, the axes rotation and Faraday rotation in the mirrored reference frame, respectively.

Writing out the matrix elements of T, we find $$f = 0, \quad g = -\sin\frac{\phi}{2} + i\cos\frac{\phi}{2} = ie^{i\phi/2}$$

In a MPD system, a phase modulation $\varphi_m$ is added to the optical signal, resulting in a modulated optical power $$I = \frac{I_0}{2}[1 + \text{Re}(g^2 e^{i\phi_m})]$$

With a proper modulation waveform and demodulation scheme, both the phase shift principal value $\varphi=\arg g^2$ and the interference contrast $k=|g^2|$ can be recovered, see e.g. [1]. Contrast k and phase shift principal value $\varphi$ can be combined into a complex value K as $$K = ke^{i\varphi} = g^2.$$

For the ideal voltage sensor described above, $K=-e^{i\varphi}$, so $\varphi=pv(\varphi+\pi)$ and $k=1$, with $pv(x)=x \mod 2\pi$ called the principal value. The $\pi$ phase offset in $\varphi$ arises from the mirrored handiness between a 90° rotation and a simple swapping of two orthogonal polarizations.

Low-Coherence Light Source

The result presented above is valid only for a MPD system operating at a single wavelength. When a low-coherence light source 9 is used, an ensemble of wave-lengths is contained in the broadband spectrum. The spectral dependence of the electro-optic phase shift $\varphi$ can be expressed as a Taylor series up to the first order $$\varphi=\varphi_0+(\tau+\tau_0)(\omega-\omega_0),$$

where $\varphi_0$ is the electro-optic phase shift at the center angular frequency $\omega_0$, $\tau$ is the electro-optic group delay, and $\tau_0$ is the group delay offset of the entire sensor system (due to other birefringent elements contained therein). Important for period disambiguation, the electro-optic group delay $\tau$ is proportional to the electro-optic phase shift $\varphi_0$ when the applied voltage varies. For BGO, $\tau/\varphi_0=0.76$ fs/rad at 1310 nm.

The detected light power in the MPD system is the ensemble average across the spectrum.

$$\langle I \rangle = \frac{1}{2}[1 + \text{Re}(\langle g^2 \rangle e^{i\phi_m})],$$

where $\langle x \rangle = \int x S(\omega) d\omega$ denotes the spectral ensemble average of a quantity x, and $S(\omega)$ is the normalized (i.e. $\int S(\omega) d\omega = 1$) optical power spectral density centered about $\omega_0$.

The MPD-retrieved complex output is then an ensemble average $K = ke^{i\varphi} = \langle g^2 \rangle = -\langle e^{i\varphi(\omega)} \rangle$, where the phase shift principal value is $\varphi = pv(\varphi_0 + \pi)$, and the interference contrast $k = A(\tau + \tau_0) = \int S(\omega) e^{i(\tau + \tau_0)(\omega - \omega_0)} d\omega$ is the coherence function $A(\tau)$ evaluated at group delay $\tau + \tau_0$.

Figure 2A:
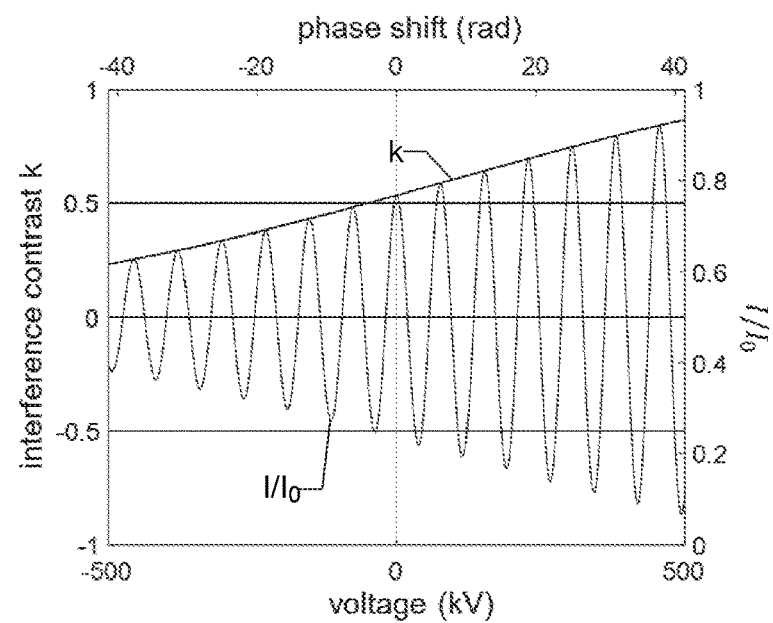
FIG. 2a shows the interference contrast k and unmodulated optical power $I/I_0$ as functions of the applied voltage and the corresponding phase shift, exemplarily for an ideal reflective BGO voltage sensor, with a 40 nm FWHM Gaussian spectrum centered at 1310 nm, and a group delay offset $\tau_0 = -60$ fs.
Figure 2B:
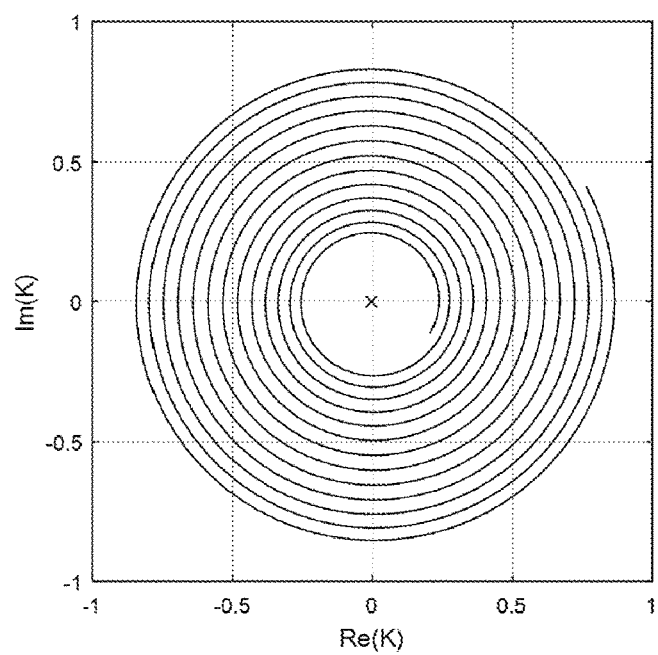
FIG. 2b shows the trace of the MPD-retrieved complex output $K = ke^{i\varphi}$ of the ideal voltage sensor in the voltage range [−500 kV, 500 kV] in the complex plane; the cross symbol indicates the center of the spiral, which is at the origin of the complex plane.

If the operating range of the sensor is chosen by selecting a proper group delay offset $\tau_0$ (by means of a birefringent element, e.g. a birefringent crystal) to represent a range where the coherence function $A(\tau)$ varies strongly and monotonically, the MPD-retrieved complex output $K = ke^{i\varphi}$ plotted on the complex plane is a spiral curve emanating from (or converging into) the origin of the complex plane. As an example, for a BGO voltage sensor ($\pi$-voltage 75 kV) with a 40 nm FWHM Gaussian spectrum centered at 1310 nm, a suitable choice of $\tau_0$ to cover $\pm 500$ kV would be around $\pm 60$ fs. In all following calculations, we assume such a spectrum and $\tau_0 = -60$ fs. The phase shift, interference contrast, and the MPD-retrieved complex output trace for the ideal voltage sensor are plotted in FIGS. 2a and 2b.

Systematic Errors:

The situation is, however, more complicated in the presence of systematic errors. For example, the Faraday rotation angle may not be exactly 45°, or the axes of the PM fiber may not be aligned exactly at 45° with the electro-optic axes of the sensing crystal. In such cases, cross-coupling occurs between orthogonal polarizations as the waves enter and exit the sensing crystal, which would disturb the MPD measurement result.

If we define the Faraday rotation as $45° + \in_F$, (with $\in_F$ describing the deviation from the ideal 45° rotation) and the angle between the electro-optic axes of the sensing element and the PM fiber axes as $45° + \in_\theta$ (with $\in_\theta$ describing the deviation from the ideal alignment of the the PM fiber axes), the sensor matrix between the two passes through the Faraday rotator is $$T = \begin{bmatrix} f & -g^* \\ g & f^* \end{bmatrix} = R(-45° - \epsilon_F)R(-45° - \epsilon_\theta)S(\phi)R(-45° - \epsilon_\theta)R(45° + \epsilon_F) =$$

$$R(-90° - \epsilon_\theta - \epsilon_F)S(\phi)R(-\epsilon_\theta + \epsilon_F)$$

The matrix elements are now $$f = \sin\frac{\phi}{2}\sin 2\epsilon_\theta - i\cos\frac{\phi}{2}\sin 2\epsilon_F$$

$$g = -\sin\frac{\phi}{2}\cos 2\epsilon_\theta + i\cos\frac{\phi}{2}\cos 2\epsilon_F$$

With a broadband spectrum, we should also take into account the wavelength dependence of the Faraday rotation angle. In a Taylor series up to the first order, the Faraday rotation angle deviation can be written as $$\in_F = \in_{F0} + \kappa(\omega - \omega_0)$$

For example, for a TGG Faraday rotator, the Faraday rotator angle $\theta_F$ varies according to $\theta_F = C/(\lambda^2 - \lambda_0^2)$, where $\lambda_0 = 258.2$ nm. Therefore, it can be estimated that a 45° TGG Faraday rotator at 1310 nm would have $\kappa = 1.13$ fs, which is much smaller compared to the typical electro-optic group delay $\tau$ (e.g. 20 fs at 1310 nm for a reflective BGO sensor at 320 kV), so we can ignore it.

The MPD-retrieved complex variable $K = ke^{i\varphi}$, which may be constructed from the MPD-measured phase shift principal value $\varphi$ and interference contrast k, is now, after wavelength-ensemble averaging $$K = \langle g^2 \rangle = -\langle \cos^2\varphi \cos^2 2\in_F \rangle + \langle \sin^2\varphi \rangle \cos^2 2\in_\theta - i$$
$$\langle \sin 2\varphi \cos 2\in_F \rangle \cos 2\in_\theta$$

Figure 3A:
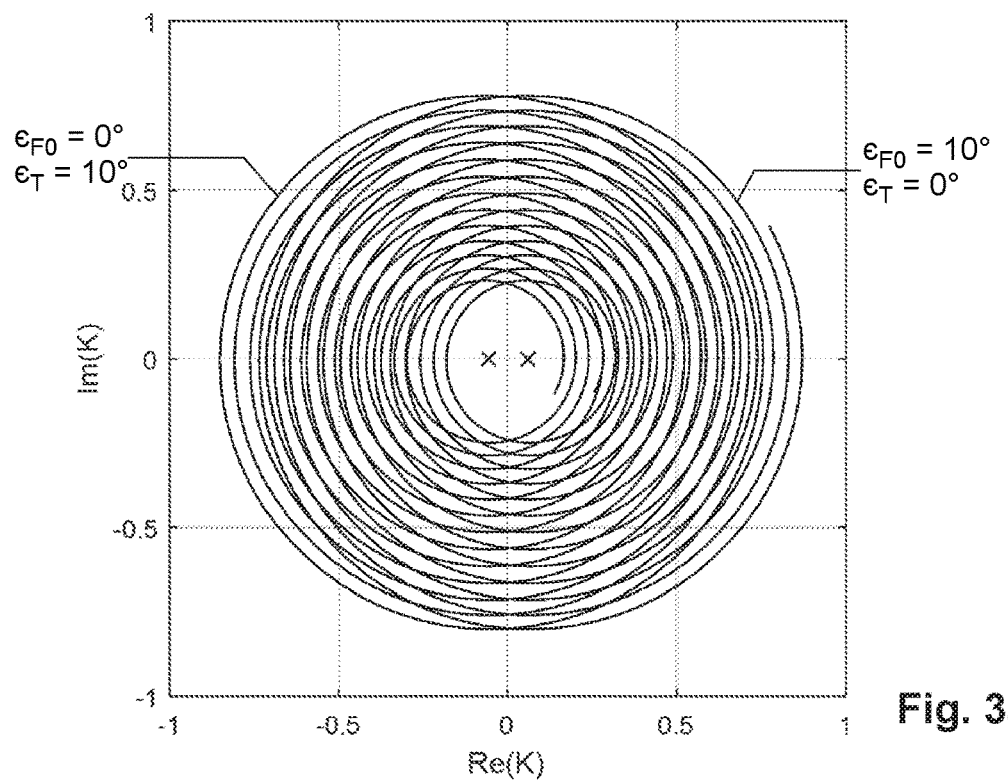
FIG. 3a shows traces of the MPD-retrieved complex output $K = ke^{i\varphi}$ in the voltage range [−500 kV, 500 kV], for a non-ideal voltage sensor with $\in_{F0} = 10°$ and $\in_\theta = 0°$ and a sensor with $\in_{F0} = 0°$ and $\in_\theta = 10°$, respectively; the cross symbols indicate the spiral centers determined by method M1 proposed herein.

The K traces calculated for two non-ideal voltage sensors are plotted in FIG. 3a. The traces still have a spiral shape, however with a few important differences from the ideal case:
1. The spiral center is shifted from the origin of the complex plane along the real axis.
2. The radii of the spiral curve change along both real and imaginary axes with different ratios, making the spiral elliptical, i.e. the spiral's real and imaginary amplitudes are scaled.

Additionally, we note that the signs of $\in_{F0}$ and $\in_\theta$ do not influence the K trace. With a non-zero $\in_{F0}$, the spiral is positively shifted along the real axis, while with a non-zero $\in_\theta$, the spiral is negatively shifted. Therefore, it is possible to compensate the Faraday rotation angle error with a corresponding "misalignment" of the PM fiber axes.

Figure 3B:
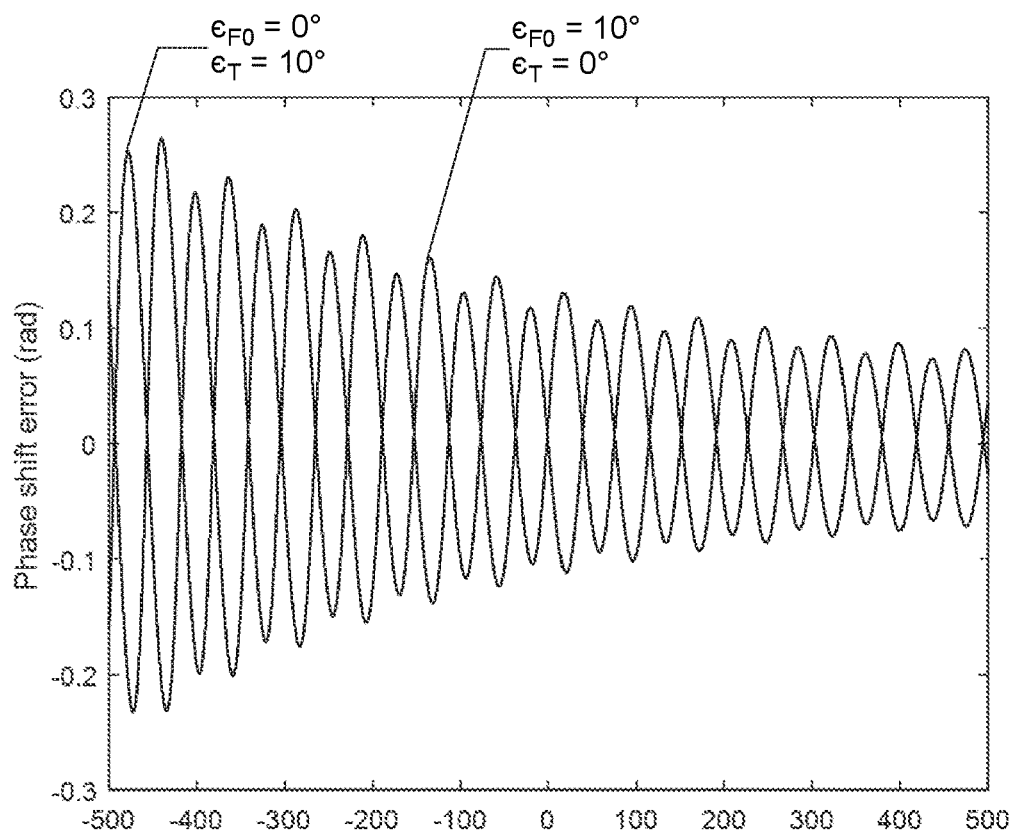

Generally, in a non-ideal sensor, arg $K \neq pv(\varphi_0 + \pi)$ and $|K| \neq A(\tau + \tau_0)$. Therefore, the phase shift calculated using the signal processing scheme described above for an ideal sensor would contain measurement error, which is plotted in FIG. 3b. A proper compensation method is required in order to reach the required accuracy.

Error Compensation:

We propose a novel compensation procedure with the following steps:
1. Determine, in particular in a calibration measurement, the spiral center $K_0$ in the complex plane, and the spiral radii in the real and imaginary axes ($r_1$ and $r_2$).
2. When carrying out a live measurement, shift the spiral center to the complex plane origin, and rescale in both real and imaginary directions. Hence, we calculate a compensated complex output value $$\tilde{K} = \left[\frac{\text{Re}(K - K_0)}{r_1} + i\frac{\text{Im}(K - K_0)}{r_2}\right]r_0 \quad (1)$$

where $r_0$ is the nominal interference contrast at the applied voltage. It is a non-zero real-valued constant value and can be chosen freely for convenience. It can e.g. be set to 1 or the theoretical optical interference contrast at zero voltage.

3. Calculate the compensated phase shift and interference contrast based on the compensated complex output $$\tilde{\varphi} = \arg \tilde{K}, \tilde{k} = |\tilde{K}|$$

The compensated outputs can then be used in the same way as for the outputs from the ideal sensor, i.e.

$$\tilde{\varphi} = pv(\varphi + \pi), \tilde{k} = A(\tau + \tau')$$

The values of $K_0$ (which is complex valued), $r_1$ and $r_2$ (both of which are real-valued) are calibration values, which are determined in a calibration process. For example, in this process, one may vary the applied voltage V in a certain range, and record the complex output K(V) at the same time. The selected voltage range should preferably cover at least one π-voltage for a reflective voltage sensor, whereby the K(V) trace would make at least one full circle around $K_0$. The selected voltage range should be in a region where the coherence function $A(\tau+\tau_0)$ is largely linear with the voltage. By proper fitting of the measured K(V) trace to a scaled Archimedes spiral model, the center $K_0$ and radii (real and imaginary scaling factors) $r_{1,2}$ can readily be determined.

Simpler methods can also work well for the same purpose without requiring computation-intensive curve fitting. Here we give two examples of methods:

M1. On a full-circle K(V) calibration trace, one may locate the point with the largest real part $K_{r1}$, the point with the smallest real part $K_{r2}$, the point with the largest imaginary part $K_{i1}$, and the point with the smallest imaginary part $K_{i2}$. Generally, $Re(K_0)=Re(K_{i1})=Re(K_{i2})$ and $Im(K_0)=Im(K_{r1})=Im(K_{r2})$. One might then set $$K_0 = Re\left(\frac{K_{i1}+K_{i2}}{2}\right) + i\,Im\left(\frac{K_{r1}+K_{r2}}{2}\right), \text{ and}$$

$$r_1 = Re\left(\frac{K_{r1}-K_{r2}}{2}\right), r_2 = Re\left(\frac{K_{i1}-K_{i2}}{2}\right).$$

M2. In addition to these points, one might additionally use the corresponding points on a subsequent circle ($K'_{r1}$ or $K'_{i1}$) as the applied voltage varies further. Then, $$K_0=(K_{r1}+K'_{r1}+K_{r2})/4=(K_{i1}+K'_{i1}+2K_{i2})/4$$

Many other implementations can also be used, avoiding curve fitting by making use of a few characteristic points on the spiral to determine its parameters.

Figure 4A:
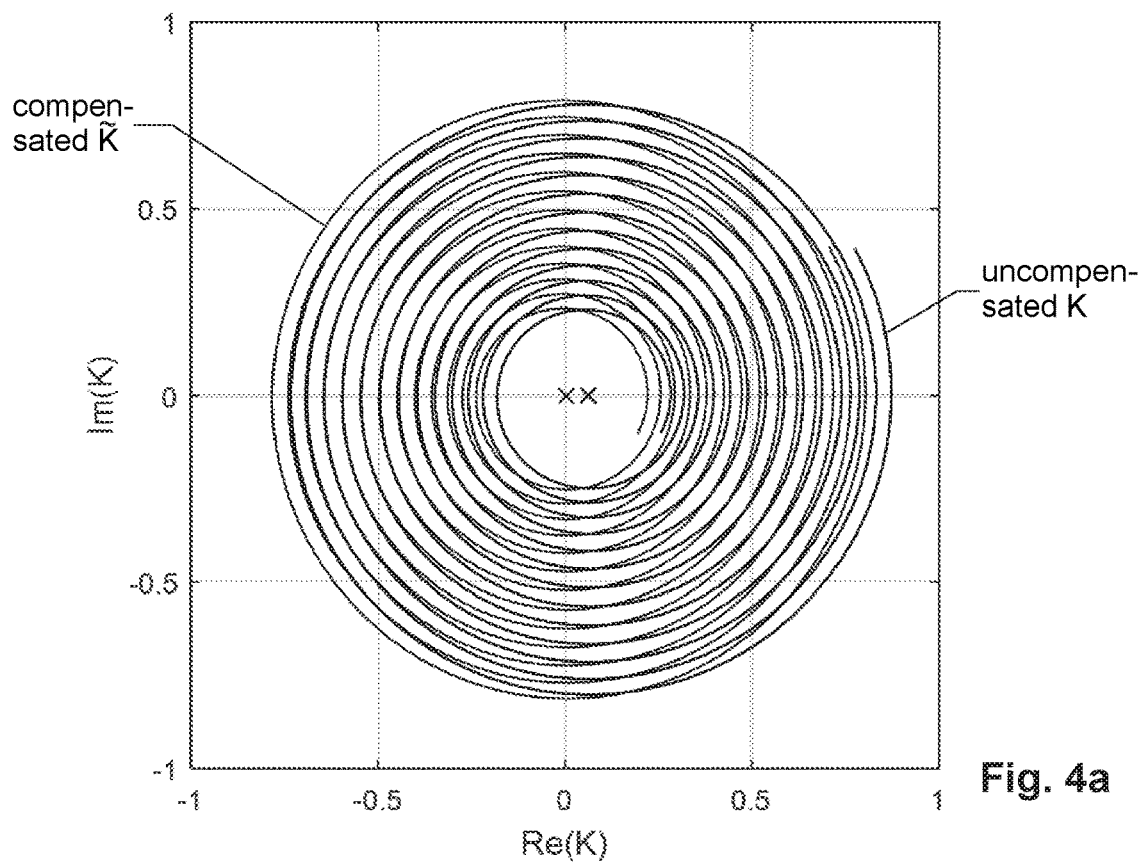
FIG. 4a shows the traces of the uncompensated K and the compensated $\tilde{K}$, calculated with the proposed method, for a non-ideal sensor with $\in_{F0} = 10°$ and $\in_\theta = 0°$; the cross symbols indicate the calculated spiral centers; the compensation parameters are determined with method M1.
Figure 4B:
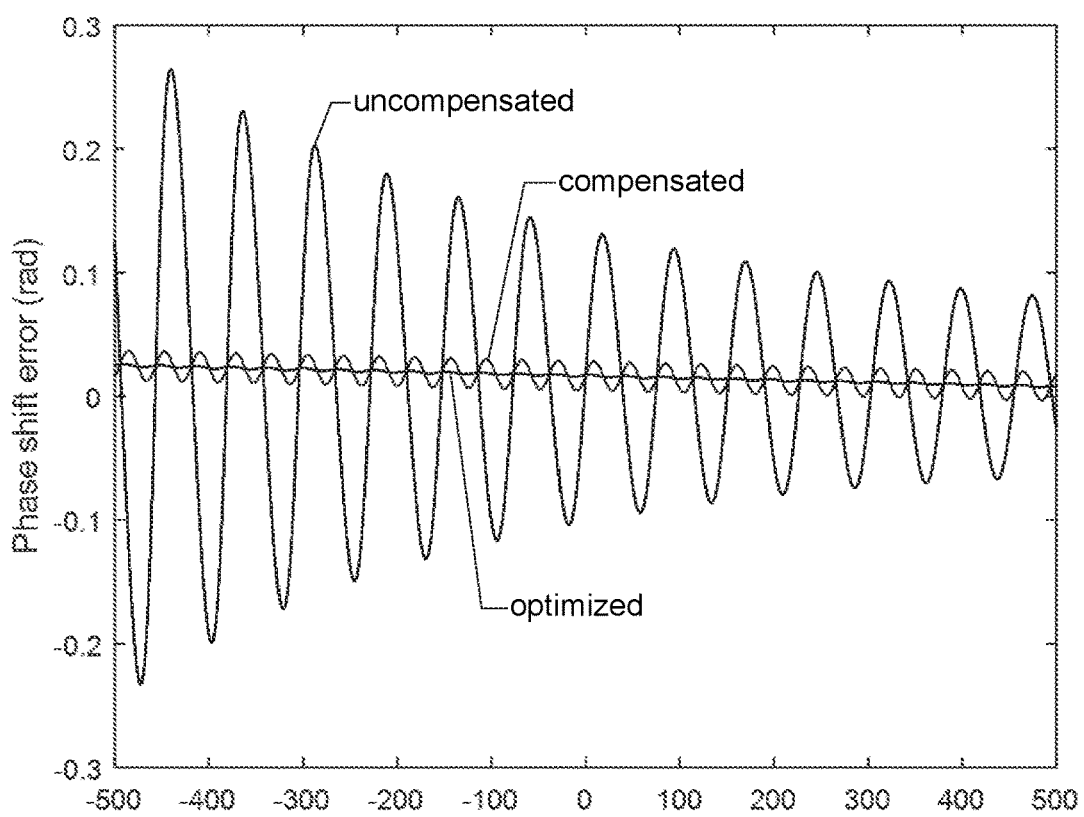
FIG. 4b shows the phase shift errors for the uncompensated, compensated (with method M1), and further optimized (fitted) outputs.

FIG. 4 shows the comparison between the uncompensated and compensated results, for a non-ideal sensor with $\in_{F0}=10°$ and $\in_\theta=0°$. The compensation with parameters determined by the simple method M1 results in significant reduction of the phase shift error over the uncompensated result. Further fine adjustment of the calibrated spiral parameters using a fitting method leads to even lower phase shift errors.

According to theoretical calculations, the spiral is expected to shift only along the real axis, i.e. Im $K_0$=0. If the MPD measurement includes an unknown offset due to other systematic errors, the complex output K trace may be rotated about the origin, which would make the spiral center appear shifted also along the imaginary axis. This effect has been observed in some measurements. Such a rotation can be described by replacing Eq. (1) by $$\tilde{K} = \left[\frac{Re(K-K_0)}{r_1} + i\frac{Im(K-K_0)}{r_2}\right]r_0 \cdot e^{i\alpha} \quad (1')$$

with $\alpha=\arg K'_0$ where $K'_0=K_0 e^{i\alpha}$ is the spiral center determined from the rotated $\tilde{K}$ trace. Once α is determined, the same procedure can be repeated for $\tilde{K}e^{-i\alpha}$ to determine the other spiral parameters $r_1$ and $r_2$. If no rotation compensation is required, the calibration value α can be set to 0 and no explicit calibration measurement may be required for its determination.

Because the Faraday rotation angle deviation $\in_{F0}$ and some other parameters (such as the electro-optic coefficient of the sensing crystal) are temperature-dependent, for a voltage sensor operating in a wide temperature range, the above-mentioned calibration (step 1) should be performed at a few representative temperatures in the given range to determine how these parameters vary with temperature. In real operation, a parallel temperature measurement is needed to properly adjust these parameters for the actual operating condition.

Hence, the present method advantageously comprises the steps of measuring the temperature at Faraday rotator 4 and selecting the calibration values as a function of this temperature. In this case, the calibration values are advantageously measured for a plurality of temperatures.

In an AC voltage measurement, the instantaneous voltage continuously sweeps along a section of the spiral trace. Therefore, it is possible to do the calibration steps (step 1 calibration) in real time during a rising or falling slope of the voltage. If the Faraday rotation angle deviation $\in_{F0}$ has the same sign in the entire temperature range, one may use the temperature dependence of the real-time-calibrated spiral parameters (also optionally the temperature dependence of the group delay offset $\tau_0$) to determine the temperature, and to perform temperature compensation of other parameters, e.g. of the electro-optic coefficient.

Notes:

Electro-optic crystal 5 can be replaced by any other electro-optic element that has exhibits a birefringence depending on the applied electrical field.

In general, the calibration values $r_1$, $r_2$, and $K_0$ and, optionally, α, are device-dependent.

The techniques shown here allow the compensation of systematic errors for an optical DC voltage sensor with measurement range >±500 kV to achieve an accuracy of <0.2%.

They are ideal for applications in HVDC air-insulated systems, HVDC cables, and DC gas-insulated switching (GIS) systems. Such GIS may be filled with dielectric gas based on SF6 or alternative gases, such as fluoroketones or fluoronitriles, preferably in mixtures with a background gas, such as e.g. selected from: nitrogen, carbon dioxide and oxygen.

They allow to compensate Faraday rotation angle errors and errors in the PM fiber alignment.

They also allow to compensate systematic errors due to changes in temperature.

While presently preferred embodiments of the invention are shown and described, it is to be distinctly understood that the invention is not limited thereto but may be otherwise variously embodied and practiced within the scope of the following claims.

REFERENCES CITED

[1] WO 2015/124676
[2] H. Lefèvre, *The Fiber-Optic Gyroscope*: Artech House, 1993.
[3] U.S. Pat. No. 7,911,196.

LIST OF REFERENCE NUMBERS

1: MPD optoelectronics module
2: PM fiber
3: collimator
4: Faraday rotator
5: crystal
6: reflector
7: phase modulator
8: detector
9: light source
10: control unit

The invention claimed is:

1. A method, performed by a device configured to measure a voltage, the method comprising:

generating a voltage-dependent phase shift between two polarizations of light by passing said light from a light source of the device through a Faraday rotator of the device and an electro-optic element of the device onto a reflector of the device and from there back through said electro-optic element and said Faraday rotator, wherein the electro optic element is placed in an electrical field generated by the voltage, measuring an interference contrast k as well as a principal value $\varphi$ of a total phase shift $\phi$ between said polarizations, calculating a corrected interference contrast $\tilde{k}$ and a corrected principal value $\tilde{\varphi}$ from $$\tilde{\varphi}=arg\ \tilde{K},\ \tilde{k}=|\tilde{K}|,$$

with $\tilde{K}$ being a compensated complex value given by $$\tilde{K} = \left[\frac{\text{Re}(K - K_0)}{r_1} + i\frac{\text{Im}(K - K_0)}{r_2}\right]r_0 \cdot e^{i\alpha}$$

wherein $r_1$, $r_2$, $K_0$ and $\alpha$ are calibration values, $r_0$ is a non-zero constant real value, and K is an uncompensated complex value given by $$K=ke^{i\varphi}$$

measuring said voltage based on said corrected interference contrast $\tilde{k}$ and the corrected principal value $\tilde{\varphi}$, and wherein at least one of the calibration values $r_1$, $r_2$, $K_0$ and $\alpha$ are determined by subjecting said electro-optic element to a varying electrical field and measuring said interference contrast k as well as said principal value $\varphi$ for several values of said varying electrical field.

2. The method of claim 1, wherein all of said calibration values $r_1$, $r_2$, $K_0$ and $\alpha$ are determined by subjecting said electro-optic element to said varying electrical field and measuring said interference contrast k as well as said principal value $\varphi$ for several values of said varying electrical field.

3. The method of claim 2, wherein said varying electrical field is varied over a range sufficient to vary a phase shift between said polarizations by at least $\pi$.

4. The method of claim 2, wherein said calibration steps comprise the step of determining a center and real and imaginary scaling factors of a spiral traced by said uncompensated complex value K when varying said principal value $\varphi$.

5. The method of claim 2, wherein said calibration steps are carried out in a calibration measurement prior to measuring said voltage.

6. The method of claim 2, wherein said voltage is an AC voltage and said calibration steps are carried out during a rising or falling slope of said voltage.

7. The method of claim 1, wherein said varying electrical field is varied over a range sufficient to vary a phase shift between said polarizations by at least $\pi$.

8. The method of claim 7, wherein said calibration steps comprise the step of determining a center and real and imaginary scaling factors of a spiral traced by said uncompensated complex value K when varying said principal value $\varphi$.

9. The method of claim 7, wherein said calibration steps are carried out in a calibration measurement prior to measuring said voltage.

10. The method of claim 7, wherein said voltage is an AC voltage and said calibration steps are carried out during a rising or falling slope of said voltage.

11. The method of claim 1, wherein said calibration steps comprise the step of determining a center and real and imaginary scaling factors of a spiral traced by said uncompensated complex value K when varying said principal value $\varphi$.

12. The method of claim 11, wherein said calibration steps are carried out in a calibration measurement prior to measuring said voltage.

13. The method of claim 1, wherein said calibration steps are carried out in a calibration measurement prior to measuring said voltage.

14. The method of claim 1, wherein said voltage is an AC voltage and said calibration steps are carried out during a rising or falling slope of said voltage.

15. The method of claim 14, further comprising the step of determining a temperature from said calibration values.

16. The method of claim 1, wherein said varying electrical field is varied over a range sufficient to vary a phase shift between said polarizations by at least $2\pi$.

17. A method, performed by a device configured to measure a voltage, the method comprising:

generating a voltage-dependent phase shift between two polarizations of light by passing said light from a light source of the device through a Faraday rotator of the device and an electro-optic element of the device onto a reflector of the device and from there back through said electro-optic element and said Faraday rotator, wherein the electro optic element is placed in an electrical field generated by the voltage, measuring an interference contrast k as well as a principal value $\varphi$ of a total phase shift $\phi$ between said polarizations, calculating a corrected interference contrast $\tilde{k}$ and a corrected principal value $\tilde{\varphi}$ from $$\tilde{\varphi}=arg\ \tilde{K},\ \tilde{k}=|\tilde{K}|,$$

with $\tilde{K}$ being a compensated complex value given by $$\tilde{K} = \left[\frac{\text{Re}(K - K_0)}{r_1} + i\frac{\text{Im}(K - K_0)}{r_2}\right]r_0 \cdot e^{i\alpha}$$

wherein $r_1$, $r_2$, $K_0$ and $\alpha$ are calibration values, $r_0$ is a non-zero constant real value, and K is an uncompensated complex value given by $$K=ke^{i\varphi}$$

measuring said voltage based on said corrected interference contrast $\tilde{k}$ and the corrected principal value $\tilde{\varphi}$, and wherein at least one of the calibration values are determined based on a measurement of a temperature at said Faraday rotator.

18. A device configured to measure a voltage, the device comprising:

a Faraday rotator, an electro-optic element, a reflector, a light source positioned to send light through said Faraday rotator and said electro-optic element onto said reflector and from there back through said electro-optic element and said Faraday rotator, wherein two polarizations of said light suffer a voltage-dependent phase shift in said electro-optic element, a light detector positioned to measure an interference between said two polarizations returning from that electro-optic element and said Faraday rotator, and a control unit configured to:

measure an interference contrast k as well as a principal value φ of a total phase shift ϕ between said polarizations, calculate a corrected interference contrast $\tilde{k}$ and a corrected principal value $\tilde{\varphi}$ from $$\tilde{\varphi}=\arg \tilde{K},\ \tilde{k}=|\tilde{K}|,$$

with $\tilde{K}$ being a compensated complex value given by $$\tilde{K} = \left[\frac{\operatorname{Re}(K - K_0)}{r_1} + i\frac{\operatorname{Im}(K - K_0)}{r_2}\right] r_0 \cdot e^{i\alpha}$$

wherein $r_1$, $r_2$, $K_0$ and $\alpha$ are calibration values, $r_0$ is a non-zero constant real value, and K is an uncompensated complex value given by $$K=ke^{i\varphi}$$

measure said voltage using said corrected interference contrast $\tilde{k}$ and the corrected principal value $\tilde{\varphi}$, wherein the control unit is further configured to determine at least one of the calibration values $r_1$, $r_2$, $K_0$ and $\alpha$ by subjecting said electro-optic element to a varying electrical field and measuring said interference contrast k as well as said principal value φ for several values of said varying electrical field.

\* \* \* \* \*